(12) United States Patent
Wang et al.

(10) Patent No.: US 9,696,384 B2
(45) Date of Patent: Jul. 4, 2017

(54) HIGH VOLTAGE BUS-TO-CHASSIS ISOLATION RESISTANCE AND Y-CAPACITANCE MEASUREMENT

(71) Applicant: GM Global Technology Operations LLC, Detroit, MI (US)

(72) Inventors: Fang Wang, Troy, MI (US); Wei Liu, Warren, MI (US); Jochen Lenz, Hattersheim (DE); Peter Andres, Ginsheim-Gustavsburg (DE)

(73) Assignee: GM Global Technology Operations LLC, Detroit, MI (US)

( * ) Notice: Subject to any disclaimer, the term of this patent is extended or adjusted under 35 U.S.C. 154(b) by 745 days.

(21) Appl. No.: 13/973,362

(22) Filed: Aug. 22, 2013

(65) Prior Publication Data

US 2014/0058687 A1 Feb. 27, 2014

Related U.S. Application Data

(60) Provisional application No. 61/692,882, filed on Aug. 24, 2012.

(51) Int. Cl.
*G01R 31/36* (2006.01)
*G01R 27/02* (2006.01)
*H01M 2/10* (2006.01)
*H01M 10/48* (2006.01)
*G01R 31/00* (2006.01)
*G01R 31/02* (2006.01)
*H01M 10/42* (2006.01)

(52) U.S. Cl.
CPC ....... *G01R 31/3624* (2013.01); *G01R 27/025* (2013.01); *H01M 2/1094* (2013.01); *H01M 10/48* (2013.01); *G01R 31/006* (2013.01); *G01R 31/025* (2013.01); *H01M 10/4228* (2013.01); *H01M 2220/20* (2013.01)

(58) Field of Classification Search
CPC G01R 31/3624; G01R 27/025; G01R 31/006; G01R 31/025; H01M 10/48; H01M 2/1094; H01M 2220/20; H01M 10/4228
See application file for complete search history.

(56) References Cited

U.S. PATENT DOCUMENTS

| 5,101,160 A * | 3/1992 | Barjonnet | G01R 31/025 324/510 |
| 6,573,728 B2 | 6/2003 | Bhatia | |
| 8,344,865 B2 | 1/2013 | Wang | |

(Continued)

*Primary Examiner* — Mohamed Charioui
*Assistant Examiner* — Jeremy Delozier
(74) *Attorney, Agent, or Firm* — Quinn IP Law (57) ABSTRACT

A system and method of simultaneously calculating an isolation resistance and a y-capacitance of a RESS may include the steps of: injecting a first signal into a RESS; recording an output signal from the RESS in response to the injection of the first signal; multiplying the first signal with the output signal to determine a first product; multiplying a second signal with the output signal to determine a second product wherein the second signal is orthogonal to the first signal; filtering the first product to determine a first constant; filtering the second product to determine a second constant; processing the first constant to determine a y-capacitance value; and processing the second constant to determine an isolation resistance value.

16 Claims, 5 Drawing Sheets

(56) References Cited

U.S. PATENT DOCUMENTS

2012/0105220 A1\* 5/2012 Wang ................... B60L 3/0046
340/438
2012/0139549 A1\* 6/2012 Sufrin-Disler ........ H02J 7/0016
324/433

\* cited by examiner

HIGH VOLTAGE BUS-TO-CHASSIS ISOLATION RESISTANCE AND Y-CAPACITANCE MEASUREMENT

CROSS REFERENCE TO RELATED APPLICATIONS

The present application hereby claims priority under 35 U.S.C. §119(e) to Provisional U.S. Application No. 61/692,882 filed Aug. 24, 2012, entitled "High Voltage Bus-to-Chassis Isolation Resistance and Y-Capacitance Measurement."

BACKGROUND

The present disclosure generally relates to a determining values corresponding to operational conditions for a hybrid or electric vehicle, and more particularly to determining the isolation properties in terms of capacitance and resistance corresponding to the operation of a battery system for an electric vehicle.

Hybrid or electric power systems provide an alternative to conventional means of vehicular motive power by either supplementing (in the case of hybrid electric vehicles (HEVs)) or completely replacing (in the case of purely electric vehicles) a traditional internal combustion engine (ICE). One form of such alternative vehicle is known as an extended range electric vehicle (EREV) that is part of a larger class of vehicles referred to as electric vehicles (EVs). In one embodiment of the EREV, primary electric drive is achieved with a battery (also known as a rechargeable energy storage system (RESS)) that acts as a direct current (DC) voltage source to a motor, generator or transmission that in turn can be used to provide the energy needed to rotate one or more of the vehicle's wheels. Once the electrical charge from the battery has been depleted, backup power may come from an ICE to provide auxiliary onboard electrical energy generation. The Chevrolet Volt is an EREV being manufactured by the Assignee of the present disclosure. Other vehicular configurations besides EREVs (including plug-in electric vehicles (PEVs)) may also benefit from the use of batteries to provide propulsive and other electric power. In the present context, an electrically-powered (or electrically-propelled) vehicle is one that derives a significant portion of its propulsive force from a battery, RESS or related electric source, even if the vehicle has EREV or HEV properties.

Various battery architectures may be employed to provide motive or related energy to an EREV, including nickel-metal hydride batteries, lead acid batteries, lithium polymer batteries and lithium-ion batteries. Of these, the lithium-ion battery appears to be particularly promising for vehicular applications. The high volumetric heat generation rate and generally passive construction of lithium-ion batteries provides both the durability and functionality needed to serve as a propulsion system for cars, trucks, buses, motorcycles and related automotive or vehicular platforms.

One consideration, irrespective of the battery form, is to control electromagnetic emissions from high voltage sources such as DC-DC converter, DC-AC inverter, electric motor and shielded or unshielded high power cables (as well as any other components connected to the high voltage bus) that are commonly used in EVs or EREVs. Capacitive devices are commonly used in those high voltage components to attenuate differential mode and common mode noises, thereby reducing emission levels and improving the quality of received signals. Some of these capacitors (named as X-capacitors) are for crossing battery positive and negative terminals, and are commonly used in those high voltage components, often specifically to limit differential mode noises. If the X-capacitors short-circuit, they run the risk of starting a fire.

Other capacitors are placed or naturally formed between either terminal of the battery system and vehicle chassis; these are named as Y-capacitors (or Y-cap for short), where Y-capacity takes into consideration a combination of both intentionally designed-in Y-cap devices and inherent (i.e., parasitic) Y-capacity formed by metal housings, cooling and related structure. As discussed herein, the total Y-cap can be used (by knowing the capacitance associated with built-in devices) to calculate the parasitic Y-capacity; changes in such value may be used (among other things) as an indication of battery health. Y-capacitance is an important property of a high voltage battery system in EV applications in that it may be used as indicia of the status of numerous system operational conditions, including those related to cooling and electronics measurement. As such, accurate detection of actual Y-cap values (as well as isolation resistance ($R_{ISO}$)) is beneficial; this additional $R_{ISO}$ information is also valuable in the event a vehicle is involved in a collision. Specifically, post-requirements on $R_{ISO}$ involve voltage-based quantities. For example, a minimum value of 500 ohms/volt may be required for electric or hybrid vehicle battery systems, or 100 ohms/volt for a fuel cell stack. Other additional specifications (such as those mandated by a particular vehicle manufacturer's internal requirements (for example, a minimum of 1 megaohm of electrical isolation)) may also be imposed on the system.

Both Y-cap or $R_{ISO}$ values are susceptible to time-varying, nonlinear and uncertainty-based conditions. In addition, severe disturbances arising from varying environmental conditions may exacerbate already difficult data acquisition and measurement. These factors make it extreme challenge to develop an effective method of detecting the actual Y-cap and $R_{ISO}$ values. Several concepts have been developed as a way to perform these tasks under non-ideal (i.e., so-called "real world") conditions. One example uses a direct current (DC) shifting method to estimate the isolation resistance, while others employ active methods to obtain the isolation information through injecting low frequency sinusoidal wave signals. Nevertheless, to the inventors knowledge, none of these approaches are able to obtain both Y-cap and isolation resistance effectively, accurately and robustly.

SUMMARY

In one embodiment, a method of simultaneously calculating an isolation resistance and a y-capacitance of a RESS may include the steps of: injecting a first signal into a RESS; recording an output signal from the RESS in response to the injection of the first signal; multiplying the first signal with the output signal to determine a first product; multiplying a second signal with the output signal to determine a second product wherein the second signal is orthogonal to the first signal; filtering the first product to determine a first constant; filtering the second product to determine a second constant; processing the first constant to determine a y-capacitance value; and processing the second constant to determine an isolation resistance value.

In another embodiment, an isolation resistance and a capacitance monitoring system may include a signal injection circuit electrically coupled to a single point in a rechargeable energy storage system (RESS) and an output circuit electrically coupled to the RESS. A monitor controller may be cooperative with the signal injection circuit and the output circuit and comprising a processor and a computer-readable medium executing an algorithm, the algorithm executing the steps of: injecting a first signal into a RESS using the signal injection circuit, recording an output signal from the output circuit in response to the injection of the first signal, multiplying the first signal with the output signal to determine a first product, multiplying a second signal with the output signal to determine a second product wherein the second signal is orthogonal to the first signal, filtering the first product to determine a first constant, filtering the second product to determine a second constant, receiving sensor information which includes at least one of the following: an amplitude of the first signal, a frequency of the first signal, an inverting gain of an inverting amplifier, a multiply gain of an multiply amplifier, and a difference gain of a differential amplifier, calculating the y-capacitance value using the sensor information and the first constant, and calculating the isolation resistance value using the sensor information and the second constant.

In yet another embodiment, a method to indicate a coolant leak in a RESS may include the steps of: monitoring a change in an isolation resistance of a high voltage bus in a RESS, wherein the isolation resistance is calculated using a monitor controller cooperative with a signal injection circuit and an output circuit, the monitor controller having a processor and a computer-readable medium executing an algorithm. The algorithm may include the steps of: injecting a first signal into a RESS using the signal injection circuit, recording an output signal from the output circuit in response to the injection of the first signal, multiplying the first signal with the output signal to determine a first product, multiplying a second signal with the output signal to determine a second product wherein the second signal is orthogonal to the first signal, calculating a low voltage signal as the difference between the output signal and the first signal, filtering the low voltage signal to remove alternating current (AC) and harmonic waveforms, recording a first data sample, waiting a discrete section of time, recording a second data sample, comparing the first data sample to the second data sample to determine if the first constant and the second constant are stable, adjusting a frequency value of the first signal and the second signal if the first constant and the second constant are not stable and injecting the first signal with the frequency value into the RESS, determining if the first constant and the second constant are stable and if stable, proceeding with the steps of processing the first constant and processing the second constant and if not stable, re-accomplishing the steps of e. through l. filtering the second product to determine a second constant, receiving sensor information which includes at least one of the following: an amplitude of the first signal, a frequency of the first signal, an inverting gain of an inverting amplifier, a multiply gain of an multiply amplifier, and a difference gain of a differential amplifier, and calculating the isolation resistance value using the sensor information and the second constant. The method further includes indicating a coolant leak warning if the isolation resistance falls below a resistance threshold value.

These and additional features provided by the embodiments described herein will be more fully understood in view of the following detailed description, in conjunction with the drawings.

BRIEF DESCRIPTION OF THE DRAWINGS

The following detailed description of the preferred embodiments of the present disclosure can be best understood when read in conjunction with the following drawings, where like structure is indicated with like reference numerals and in which.

DETAILED DESCRIPTION

Figure 1:
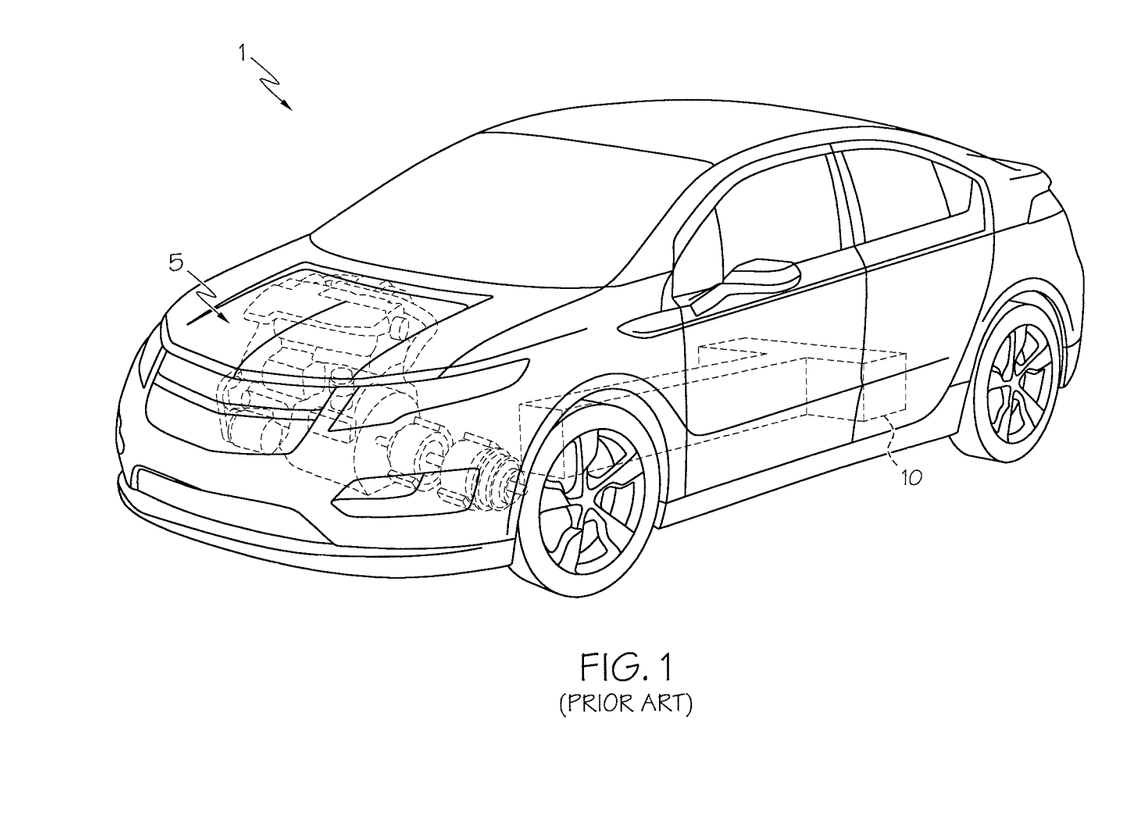
FIG. 1 shows an electrically-powered vehicle that incorporates the detection approach of the present disclosure.

Referring first to FIG. 1, a vehicle 100 includes a hybrid propulsion system in the form of a conventional ICE 110 and a battery module 105 made up of numerous battery cells 115. As such, vehicle 100 is an HEV, as mentioned above. It will be appreciated by those skilled in the art that vehicle 100 may not require the conventional ICE 110; in such case, rather than being an HEV, it is an EV; either form is within the scope of the present disclosure. The individual battery cells 115 are typically arranged in a repeating array as shown. In one typical example, battery module 105 may include about two hundred individual battery cells 115, although it will be appreciated by those skilled in the art that additional or fewer battery cells 115 may be needed, depending on the power and energy required. Additional drivetrain components (none of which are shown) useful in providing propulsive power to one or more of the wheels 130 and coupled to one or both of the battery module 105 and the conventional ICE 110 are understood to include electric motors, rotating shafts, axles, transmission or the like. The chassis 140 forms the basic structural framework, and includes a frame (on which the body is mounted in body-on-frame configurations), wheels 130 and propulsive machinery such as the engine, transmission, driveshaft, differential and suspension. It will be understood by those skilled in the art that unibody (or monocoque) designs tend to blur the lines between the structural chassis and the body, fenders and related coachwork; nevertheless, in either configuration, vehicle 100 includes the fundamental structural features associated with chassis 140, and either variant is deemed to be within the scope of the present disclosure.

Figure 2:
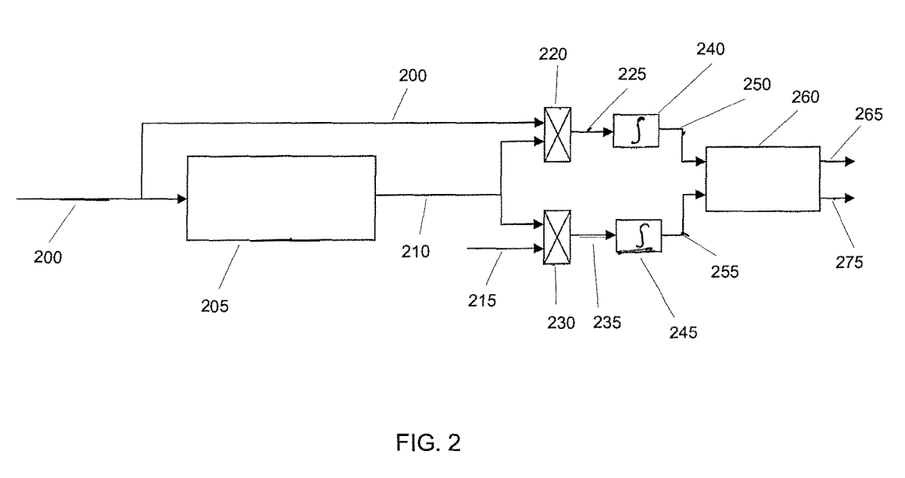
FIG. 2 depicts the methodology for determining the Y-cap and RISO values

FIG. 2 depicts the methodology for determining the Y-cap and $R_{ISO}$ values. A first signal 200 is injected into a RESS 205 to trigger the electrical system of the RESS 205 to respond in a way that such response is uniquely processed to obtain the Y-cap and $R_{ISO}$ values. The electrical system of the RESS 205 may include cable/wiring/busbar components which electrical couple the components of the RESS 205 together to include an electrical coupling to a vehicle chassis ground. The electrical system may also include cell monitoring and battery management electronic modules, disconnect units from battery cells to vehicle drive units, thermal units, charging units, service disconnect unit, circuit protection devices, and electrical load devices such as vehicle HVAC, illumination, indication systems, and the like. The response from the RESS may be in the form of an output signal 210. The output signal 210 may be processed to determine a Y-cap value and $R_{ISO}$ values as explained below.

The first signal 200 may be injected into the RESS 205 using either an indirect or a direct method as described in greater detail below. Herein, the term "inject" relates to the input of a subject signal into the electrical system of the RESS 205. In this case, the subject signal is the first signal 200 and the first signal 200 may be a sinusoidal signal, a square wave signal, a clipped signal, an impulse signal, analog signal, digital signal, a discrete signal, a continuous signal, a carrier signal with additional signals riding the carrier signal, or a combination of the above signals. The output signal 210 may be recorded or received from the RESS 205 using either an indirect or direct method as described below. The output signal 210 may be a response of the RESS 205 to the injection of the first signal 200.

The output signal 210 may be processed to determine the Y-cap and $R_{ISO}$. The output signal is multiplied by the first signal 200 and by a second signal 215. A first multiplication stage 220 results in a first product 225 by multiplying the first signal 200 and the output signal 210. A second multiplication stage 230 results in a second product 235 by multiplying the second signal 215 and the output signal 210. The first product is than processed through a first filter 240 to determine a first constant 250. The second product is processed through a second filter 245 to determine a second constant 255. Signal filtering may be employed to satisfy certain sampling criteria (for example, Shannon's theorem that relates maximum frequency content to a fraction of the sampling frequency), making certain that such criteria is fulfilled before sampling (discretizing) the signals. The first constant 250 and the second constant 255 may be a direct current (DC) signal or an alternating current (AC) signal or a combination of the DC signal and the AC signal. The determination of the first constant 250 and the second constant 255 are explained in greater detail below. The first constant 250 and the second constant are then processed in a post processing 260 to determine a Y-cap value 265 and a $R_{ISO}$ value 275. The post processing 260 is discussed below in greater detail.

Specifically, the detection of the Y-cap and $R_{ISO}$ takes into consideration that the high voltage bus-to-chassis is a dynamic system where the input (e.g. first signal 200) may be an orthogonal signal described by the following equation (2-1) and the output signal 210 (e.g. the response of the RESS 205 to the input (first signal 200)) contains basic system information including Y-cap and $R_{ISO}$. In the present context, orthogonal signals f(t) (e.g. the first signal 200) and g(t) (e.g. the second signal 215) are defined mathematically as two signals that are perpendicular such that their inner product is zero for f(t)≠g(t). This is expressed mathematically by.

$$\int_0^t f(t)g(t)dt=0, f(t) \neq g(t) \quad (2\text{-}1)$$

The output signal 210 (y(t)) is the response of the RESS 205 to the first signal 205 (f(t)). The output signal 210 (y(t)), and can be expended by Chebyshev polynomials which is a function of the first signal 200 (f(t)) and also orthogonal to the second signal 215 (g(t)) as follows:

$$y(t)=T_1(f)+T_2(f)+\ldots+T_i(f)+ \quad (2\text{-}2)$$

$$\int_0^t f(t)y(t)dt=\int_0^t f(t)(T_1(f)+T_2(f)+\ldots+T_i(f)+\ldots)dt=\int_0^t f(t)(T_1(f)dt=A \quad (2\text{-}3)$$

$$\int_0^t g(t)y(t)dt=\int_0^t g(t)(T_1(f)+T_2(f)+\ldots+T_i(f)+\ldots)dt=\int_0^t g(t)(T_g(t)dt=B \quad (2\text{-}4)$$

The above equations show that integration of the product of input signals (e.g. the first signal 200 and the second signal 215) and system output (e.g. output signal 210) results in two constants, the first constant 250 (A) and the second constant 255 (B) which are the products of the orthogonal signal (e.g. the first signal 200 and the second signal 215) of the input and system output (e.g. output signal 210). From this, a system (as shown with particularity in FIG. 3) is constructed to detect and map the Y-cap and $R_{ISO}$ that correspond to the first constant 250 (A) and the second constant 255 (B) of the first signal 200 and the second signal 215 injecting into the RESS 205.

A special case of above concept uses trigonometric signals as the orthogonal signals. In such case, f(t)=sin(ωt) and g(t)=cos(ωt). From this, Fourier series theory expresses the output of the system (response to the input) y(t) as:

$$y(t) = \frac{a_0}{2} + \sum_{n=1}^{\infty} [a_n \cos(n\omega t) + b_n \sin(n\omega t)] \quad (2\text{-}5)$$

$$a_n = \frac{1}{\pi}\int_{-\pi}^{\pi} y(t)\cos(n\omega t)dt, n \geq 0$$

$$b_n = \frac{1}{\pi}\int_{-\pi}^{\pi} y(t)\sin(n\omega t)dt, n \geq 1$$

From this, the equation (2-3) and (2-4) will be detailed as:

$$\int_{-\pi}^{\pi} \sin(\omega t)y(t)dt = \quad (2\text{-}6)$$

$$\int_{-\pi}^{\pi} \sin(\omega t)\left\{\frac{a_0}{2} + \sum_{n=1}^{\infty}[a_n\cos(n\omega t) + b_n\sin(n\omega t)]\right\}dt =$$

$$\int_{-\pi}^{\pi} b_1\sin^2(\omega t)dt = A$$

$$\int_{-\pi}^{\pi} \cos(\omega t)y(t)dt = \quad (2\text{-}7)$$

$$\int_{-\pi}^{\pi} \cos(\omega t)\left\{\frac{a_0}{2} + \sum_{n=1}^{\infty}[a_n\cos(n\omega t) + b_n\sin(n\omega t)]\right\}dt =$$

$$\int_{-\pi}^{\pi} a_1\cos^2(\omega t)dt = B$$

Correspondingly, the Y-cap and $R_{ISO}$ could be mapped based on A and B from the following equation:

$$\begin{bmatrix} Y_{cap} \\ R_{iso} \end{bmatrix} = \begin{bmatrix} \varphi_{11}(A, B) & \varphi_{12}(A, B) \\ \varphi_{21}(A, B) & \varphi_{22}(A, B) \end{bmatrix} \quad (2\text{-}8)$$

Significantly, Y-cap and $R_{ISO}$ may be obtained simultaneously. This simultaneous acquisition makes the isolation measurement less sensitive to Y-cap values because $R_{ISO}$ is calculated dynamically along with Y-cap on the bus, the bus is part of the electrical system of the RESS 205. In a related way, the measured Y-cap is useful for other vehicle diagnoses. For example, monitoring the Y-cap can help with determining the condensation level of the ambient air, coolant level of the vehicle 100 of FIG. 1, and/or a position of the electrical contactors on the bus. Farthing the example in regards to the position of the electrical contactors, when the electrical contactors are in an open position, the Y-cap reflects a fill level of a coolant fluid in a coolant system of the vehicle 100. When the electrical contactors are in a closed position, the Y-cap reflects the electrical combination of several high voltage components throughout the electrical system of the RESS 205 to include a traction power inverter (TPIM). If the Y-cap is different from an expected Y-cap value when the electrical contactors are in the closed position, a diagnostic trouble code may be indicated. A diagnostic trouble code may be indicated through an on-board diagnostic trouble code (e.g. OBD II standard), a visual indicator, an auditory indicator, a stored error log in a computer readable medium (e.g. memory), or a combination of the above.

Specifically, the first signal 200 may be injected into RESS 205 either by a dedicated circuit electrically coupled to the RESS 205, or a controller electrically coupled to the RESS 205, but not limited to these. In one embodiment, the first signal 200 may be indirectly injected into the RESS 205 using a non-inverting summing amplifier as described in greater detail below in reference to FIG. 3. In another embodiment, the first signal 200 may be directly injected into the RESS 205 by electrically coupling a signal generator to the electrical system of the RESS 205 as discussed in greater detail below in reference to FIG. 4. The output signal 210 may be received or read from the electrical system of the RESS. In one embodiment, the output signal 210 may be received using a dedicated circuit, such as a difference amplifier as explained below in FIG. 3. In another embodiment, the output signal 210 may be received indirectly using one or more sensors that are electrically coupled to the RESS 205, but have a primary purpose other than receiving and/or recording the output signal 210. For example, a sensor used to measure a voltage output value of the RESS 205 may also be re-purposed to record the output signal 210. "Record" the output signal 210 may include reading the signal in the electrical system of the RESS 205 and/or receiving the output signal 210 from the RESS 205. As another example, a controller may be electrically coupled to the electrical system of the RESS 205 and indirectly record the output signal 210 as one or more sensors electrically coupled to the RESS 205 pick-up the output signal 210. The controller may use a first frequency of the first signal 200 as an indication of the output signal 210 that may be recorded by the one or more sensors. In one embodiment, the first frequency of the first signal may be used to match a second frequency of the output signal 210. In another embodiment, the first frequency of the first signal 200 may be used to translate the second frequency of the output signal by knowing a phase shift between the first frequency and the second frequency.

Figure 3:
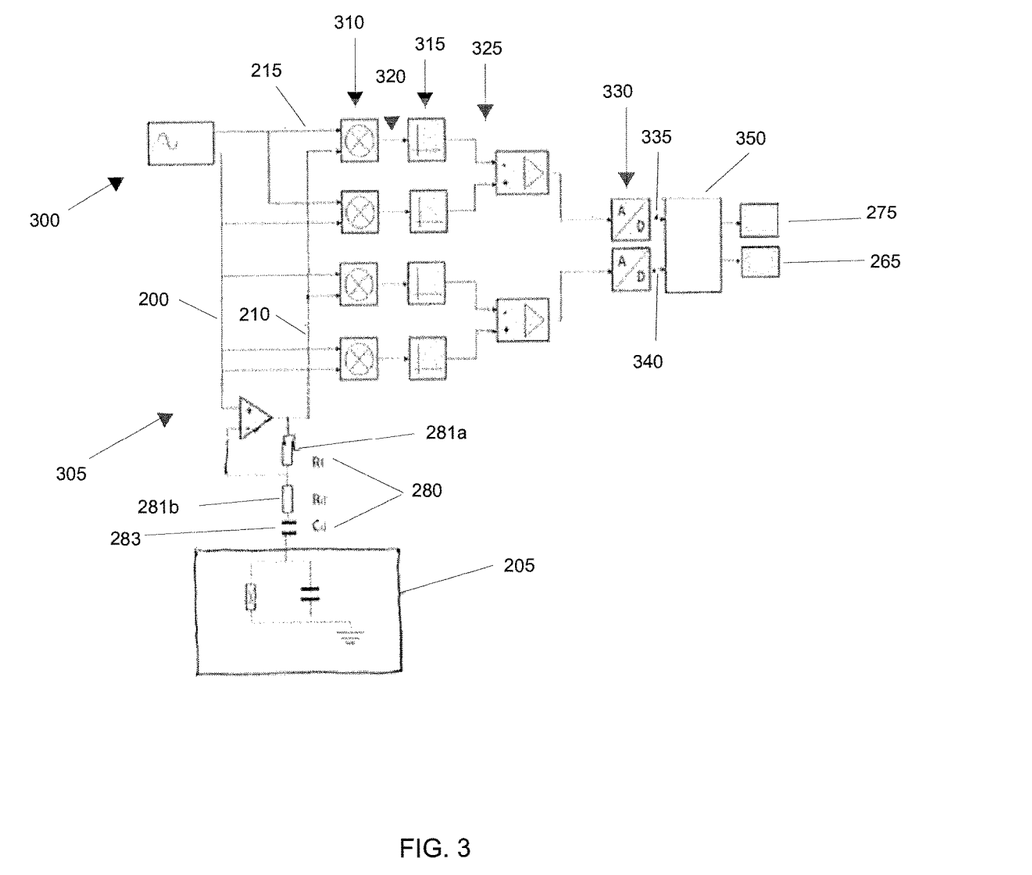
FIG. 3 shows a hardware implementation according to one exemplary embodiment of the present disclosure.

Two hardware implementation embodiments are discussed in more detail. In one embodiment, the hardware implementation of a circuit used for an indirect injecting of a signal is shown in FIG. 3. FIG. 3 depicts the indirect injecting where the principle circuit may be a non-inverting summing amplifier 300 and a difference amplifier 305. The difference amplifier 305 may be used to maximize the resolution of an A/D converter, thereby further improving the measurement accuracy. The non-inverting summing amplifier 300 may be used to inject the first signal 200 into the RESS 205 and a difference amplifier 305 may be used to receive and amplify the output signal 210 for further processing. The non-inverting summing amplifier 300 may include a signal generator to produce the first signal 200. The signal generator may be an oscillating analog circuit or the controller 350 with a digital to analog converter (DAC) output. The signal generator may also produce the second signal 215. The non-inverting summing amplifier 300 strengthens and improves the sensitivity of the response and provides for accuracy of the signals. A coupling circuit 280 may be included to electrically couple the non-inverting summing amplifier 300 to the RESS 205. The coupling circuit 280 may include one or more coupling resistors 281 ($R_f$ and/or $R_d$) and a coupling capacitor 283 ($C_d$).

Still referring to FIG. 3, the first signal 200, the second signal 215, and the output signal 210 may be inputted into a plurality of multipliers 310. The plurality of multipliers 310 then input a plurality of multiplex results 320 into a plurality of filters 315. The plurality of filters 315 are used to remove any alternating current (AC) components and any bus harmonics that may be part of the plurality of multiplex results 320. The plurality of filtered outputs 325 may be combined and inputted into one or more analog to digital (A/D) converters 330. The plurality of filtered outputs 325 may be a direct current (DC) signal. The A/D converters 330 provide a first digital signal 335 and a second digital signal 340 to the controller 350. The controller 350 may execute an algorithm 500 (FIG. 5) to calculate the Y-cap value 265 and $R_{ISO}$ value 275. The controller 350 may also be used to define and generate the first signal 200 and the second signal 215 as described above. In another embodiment, the controller 350 may be an application specific integrated chip (ASIC) with the ability to calculate the Y-cap value 265 and the $R_{ISO}$ value 275 without the need for the algorithm 500.

Figure 4:
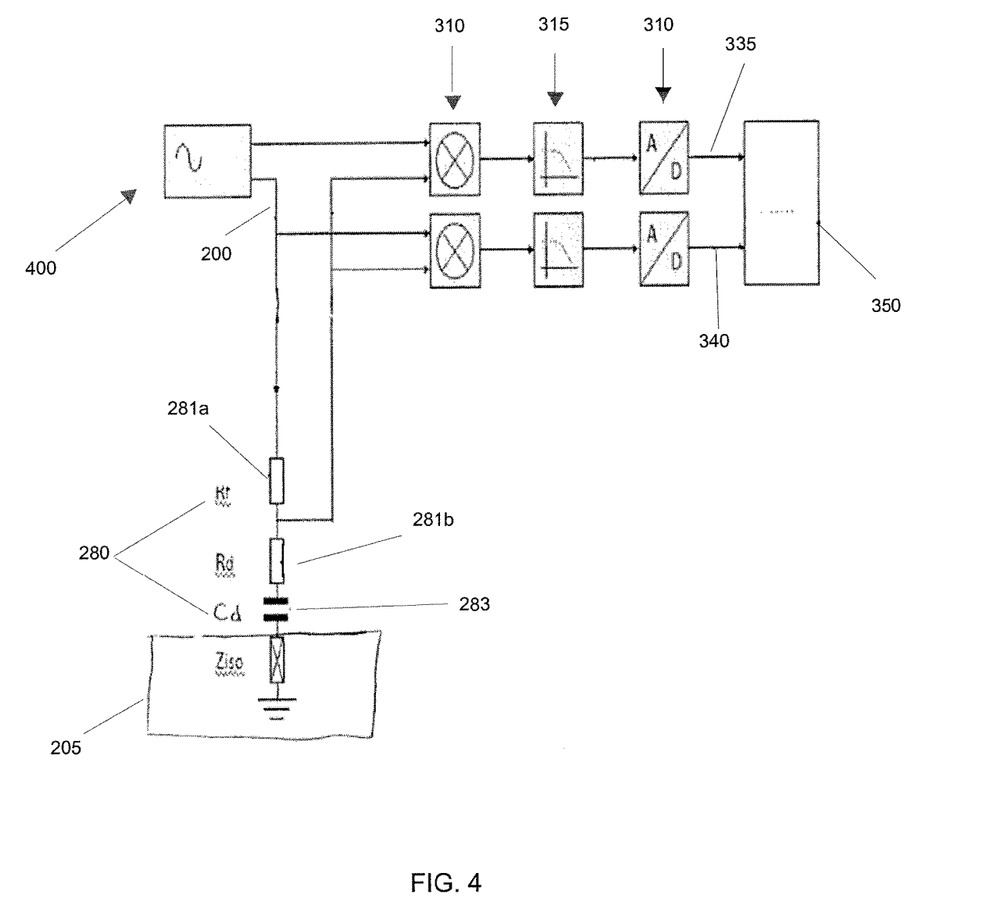
FIG. 4 shows a hardware implementation according to another exemplary embodiment of the present disclosure.

FIG. 4 depicts the direct injection of the first signal 200 into the RESS 205 using a signal generator 400. The signal generator may be an oscillating analog circuit or a controller with a digital to analog converter (DAC) output. The output signal 210 from the RESS 205 may be inputted into the plurality of multipliers 310. The plurality of multipliers 310 then input the plurality of multiplex results 320 into the plurality of filters 315. The plurality of filters 315 are used to remove any alternating current (AC) components and any bus harmonics that may be part of the plurality of multiplex results 320. The plurality of filtered outputs 325 may be combined and inputted into the one or more analog to digital (A/D) converters 330. The plurality of filtered outputs 325 may be a direct current (DC) signal. The A/D converters 330 provide the first digital signal 335 and the second digital signal 340 to the controller 350. The controller 350 may execute the algorithm 500 to calculate the Y-cap value 265 and $R_{ISO}$ value 275. Direct injecting of the first signal 200 is better for bus noise handling. The on-board signal generator may be integrated to work alone with limited interference with the controller 350. The coupling circuit 280 may be included to electrically couple the signal generator 400 to the RESS 205. The coupling circuit 280 may include one or more coupling resistors 281 ($R_f$ and/or $R_d$) and the coupling capacitor 283 ($C_d$).

Figure 5:
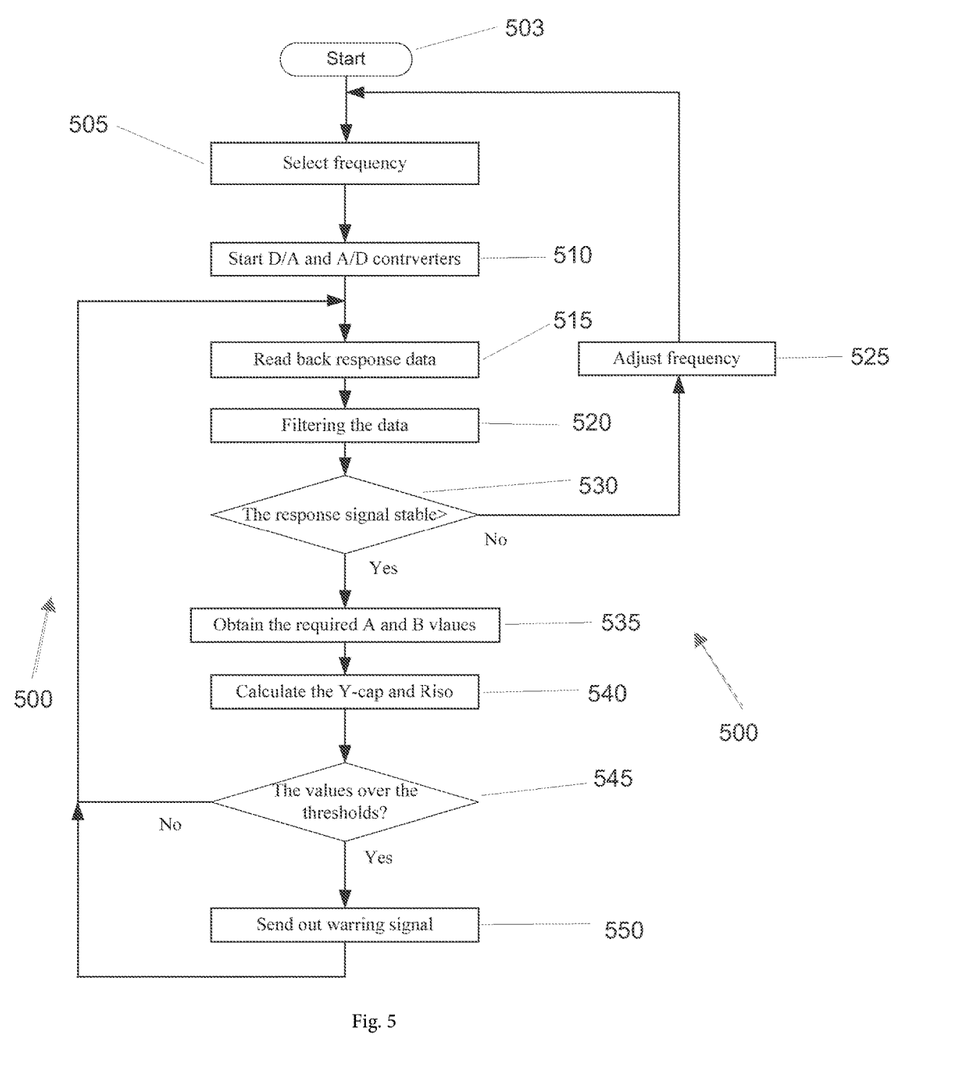
FIG. 5 shows a software implementation diagram according to one of the exemplary embodiments of the present disclosure.

Referring next to FIG. 5, an embodiment of the algorithm 500 is shown. In this embodiment, the algorithm 500 may be used in addition to (or in place of) the aforementioned hardware implementations. The signal generator, either through hardware such as the signal generator 400 of FIG. 4, or through software using the controller 350 and a DAC may be used to input the first signal 200 into the RESS 205.

The algorithm is executed in the controller 350. The controller 350 may be electrically coupled to one or more sensors, the one or more sensors electrically coupled to the electrical system of the RESS 205 and/or other equipment and devices throughout the vehicle 100 of FIG. 1 to monitor and/or control the electrical system of the RESS 205 and/or other equipment and devices throughout the vehicle 100. The controller may receive sensor information which may include at least one of the following: an amplitude of the first signal 200, an amplitude of the second signal 215, a frequency of the first signal 200, a frequency of the second signal 215, an inverting gain of an inverting amplifier, a multiply gain of an multiply amplifier, and a difference gain of the difference amplifier 305. The signal injected into the RESS 205 may be either a discrete component or part of the controller 350. The multiply amplifier may be either a discrete component or part of the controller 350 that amplifies the first signal 200 in the first multiplication stage 220 and the second signal 215 in the second multiplication stage 230.

The algorithm 500 may direct the signal generator to modify a frequency 505 of the first signal 200 and the second signal 215. For example, the frequency 505 may either be a fixed frequency or variable frequency, depending on the actual implementation. For example, the benefit of a variable frequency is to adapt to the Y-cap. The combination of "$R_{ISO}$" and "Y-cap" forms a characteristic frequency $1/(2\pi RC)$, which gives the point of best sensitivity. The first frequency of the injected first signal 200 and second signal 215 may be further adapted to have the response be stable and of good quality, even in the presence of severe noise or other environmental or ambient disturbances, such as those that occur during various driving conditions where the dynamic (i.e., time-varying) power draw from the battery would otherwise reduce measurement accuracy. Thus, variable frequency measurements may be made (from which an average value can be derived) to improve the accuracy of more complex systems with multiple operation modes. As stated above, variable frequencies can improve measurement accuracy, for example in situations where one frequency used is similar to a voltage swing frequency on the bus of the RESS 205.

The initiation of the A/D converters or D/A (i.e. DAC) converters 510 may be generated by software through the controller 350 or the oscillating analog circuit. Specifically, the D/A converter 510 may be used to start the injection of the first signal 200 into the RESS 205. The D/A converters 510 may electrically coupled to electrical system of the RESS 205 through a coupling network that serves as an isolation circuit between the high voltage electrical system of the RESS 205 and the control circuitry. For example, the coupling network may be in the form of the difference amplifier 305 of FIG. 3 or the signal generator 400 of FIG. 4 and may include the coupling circuit 280. The signal generator 400 may include an op-amp isolation circuit to allow the electrical coupling of the signal generator 400 to the electrical system of the RESS 205. From this, low voltage response data is retrieved from the RESS 205 (with additional analog signal processing) by the A/D converter (240 of FIG. 2 and 330 of FIGS. 3 and 4). The low voltage response data is a difference between the output signal 210 and that of the originally-injected signals (e.g. the first signal 200 and the second signal 215). To illustrate, there may be a difference in an amplitude and a phase between the first signal 200 and output signal 210. The first multiplication stage 220 and the first filter 240 may be used to determine an amplitude difference in the amplitude. The second multiplication stage 230 and the second filter 245 may be used to determine a phase difference in the phase. The first constant 250 (A) and the second constant 255 (B) are the analog DC signals to be converted to digital signal using the D/A converter to input to the controller 350. The subsequent filtering of the low voltage data may be achieved by hardware or software-based means. A determination of the stability of the response may be used to make sure the measurement was suitably robust. For example, to determine stability, one or more data samples of a limited duration are taken for the first constant 250 (A) and the second constant 255 (B). When the one or more data samples match or about match, i.e. a first data sample of A matches or about matches a second data sample of A, the low voltage data may be determined to be stable. "About matches" may include a tolerance or variability in the comparison of two or more data sets that may not affect the outcome of the determination. The determination may be needed because whenever a signal is injected and processed, it takes a finite amount of time for the amplitude and phase to cease oscillating or become stable. Once ample signal stability is verified, the constants A and B (e.g. the first constant 250 and the second constant 255) of the product signals (e.g. the first multiplication stage 220 and the second multiplication stage 230) and system output (output signal 210) may be locked in and used for mathematical processing (e.g. post processing 260) to determine actual Y-cap and RISO values. Additional isolation fault detection may be run to ensure that $R_{ISO}$ or other vehicle diagnostics based on the Y-cap value are not in excess of permissible limits. Lastly, the system may be subjected to continuous monitoring. If the permissible limits are exceeded (either above or below), the vehicle's 100 of FIG. 1 control system may be used to set a control or diagnostic code.

In addition, the first constant 250 (A) and the second constant 255 (B) may be processed mathematically in the post processing 260 so that their corresponding values may be mapped back to actual Y-cap and $R_{ISO}$ values. In one preferred embodiment, a CPU-based mapping back approach (with its attendant accuracy) is employed. The CPU-based mapping solves the complex equations which describe the coupling network described above.

As explained above, the first signal 200 and the second signal 215 may be orthogonal signals. The first signal 200 and the second signal 215 are orthogonal when their inner product is zero. In another embodiment, the first signal 200 may be a sine wave and the second signal 215 may be a cosine wave. In yet another embodiment, the first signal 200 may be a cosine signal and the second signal 215 may be a sine wave.

The present disclosure may be embodied in hardware and/or in software (including firmware, resident software, micro-code, etc.). The controller may have at least one processor and the computer-readable medium. A computer-usable or the computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code (algorithm 500) for carrying out operations of the present disclosure may be written in a high-level programming language, such as C or C++, for development convenience. In addition, computer program code for carrying out operations of the present disclosure may also be written in other programming languages, such as, but not limited to, interpreted languages. Some modules or routines may be written in assembly language or even micro-code to enhance performance and/or memory usage. However, software embodiments of the present disclosure do not depend on implementation with a particular programming language. It will be further appreciated that the functionality of any or all of the program modules may also be implemented using discrete hardware components, one or more application specific integrated circuits (ASICs), or a programmed digital signal processor or microcontroller.

The foregoing detailed description and preferred embodiments therein are being given by way of illustration and example only; additional variations in form or detail will readily suggest themselves to those skilled in the art without departing from the spirit of the disclosure. Accordingly, the scope of the disclosure should be understood to be limited only by the appended claims.

What is claimed is:

1. A method of simultaneously calculating an isolation resistance and a y-capacitance of a rechargeable energy storage system (RESS), the method comprising:
   injecting, via a wire electrically coupled to the RESS, a first signal into the RESS, the RESS having a charge capable of providing propulsive and other electric power to a vehicle;
   recording, via a sensor, an output signal from the RESS in response to the injection of the first signal;
   multiplying, via at least one multiplier, the first signal with the output signal to determine a first product;
   multiplying, via the at least one multiplier, a second signal with the output signal to determine a second product, the second signal being orthogonal to the first signal;
   filtering, via at least one filter, the first product to determine a first constant;
   filtering, via the at least one filter, the second product to determine a second constant;
   processing, via at least one processor, the first constant to determine a y-capacitance value; and
   processing, via the at least one processor, the second constant to determine an isolation resistance value;
   controlling, in response to the y-capacitance value or the isolation resistance value being in excess of the predetermined value, the RESS to operate the RESS in excess of the predetermined value.

2. The method of claim 1, wherein the injection of the first signal is through a signal injection circuit electrically coupled to the RESS at a single point to inject the first signal into the RESS.

3. The method of claim 2, wherein the signal injection circuit comprises a non-inverting summing amplifier to inject the first signal into the RESS, and wherein the output signal is recorded using a difference amplifier.

4. The method of claim 2, wherein the single point is a high voltage bus of the RESS.

5. The method of claim 1, wherein the first signal is a sine wave and the second signal is a cosine wave.

6. The method of claim 1, wherein the first signal is a cosine wave and the second signal is a sine wave.

7. The method of claim 1, wherein the processing of the first constant and the second constant are done by a monitor controller having a processor and a computer-readable medium executing an algorithm, the algorithm executing the steps of:
   receiving sensor information which includes at least one of the following: an amplitude of the first signal, a frequency of the first signal, an inverting gain of an inverting amplifier, a multiply gain of a multiply amplifier, and a difference gain of a differential amplifier;
   calculating the y-capacitance value using the sensor information and the first constant; and
   calculating the isolation resistance value using the sensor information and the second constant.

8. calculating a low voltage signal as a difference between the output signal and the first signal;
   filtering the low voltage signal to remove alternating current (AC) and harmonic waveforms;
   recording a first data sample;
   waiting a discrete section of time;
   recording a second data sample;
   comparing the first data sample to the second data sample to determine if the first constant and the second constant are stable;
   adjusting a frequency value of the first signal and the second signal if the first constant and the second constant are not stable and injecting the first signal with the frequency value into the RESS; and
   determining if the first constant and the second constant are stable and if stable, proceeding with the steps of processing the first constant and processing the second constant and if not stable, re-accomplishing calculating the low voltage signal, filtering the low voltage signal, recording the first data sample, waiting the discrete section of time, recording the second data sample, comparing the first data sample to the second data sample, adjusting the frequency value if the first constant and the second constant are not stable, injecting the first signal with the frequency value into the RESS, and determining if the first constant and the second constant are stable.

9. An isolation resistance and a capacitance monitoring system, comprising:
   a signal injection circuit electrically coupled to a single point in a rechargeable energy storage system (RESS);
   an output circuit electrically coupled to a RESS; and
   a monitor controller cooperative with the signal injection circuit and the output circuit and comprising a processor and a computer-readable medium executing an algorithm, the algorithm executing the steps of:
   injecting a first signal into the RESS using the signal injection circuit,
   recording an output signal from the output circuit in response to the injection of the first signal,
   multiplying the first signal with the output signal to determine a first product,
   multiplying a second signal with the output signal to determine a second product wherein the second signal is orthogonal to the first signal,
   filtering the first product to determine a first constant,
   filtering the second product to determine a second constant,
   receiving sensor information which includes at least one of the following: an amplitude of the first signal, a frequency of the first signal, an inverting gain of an inverting amplifier, a multiply gain of an multiply amplifier, and a difference gain of a differential amplifier;
   calculating a y-capacitance value using the sensor information and the first constant,
   calculating an isolation resistance value using the sensor information and the second constant, and
   controlling, in response to the y-capacitance value or the isolation resistance value being in excess of the predetermined value, the RESS to operate the RESS in excess of the predetermined value.

10. The monitoring system of claim 9, wherein the signal injection circuit comprises a non-inverting summing amplifier to inject the first signal into the RESS, and wherein the output signal is recorded using a difference amplifier.

11. The monitoring system of claim 9, wherein the single point is a high voltage bus of the RESS.

12. The monitoring system of claim 9, wherein the first signal is orthogonal to the second signal.

13. The monitoring system of claim 9, wherein the first signal is a sine wave and the second signal is a cosine wave.

14. The monitoring system of claim 9, wherein the first signal is a cosine wave and the second signal is a sine wave.

15. calculating a low voltage signal as a difference between the output signal and the first signal;
    filtering the low voltage signal to remove alternating current (AC) and harmonic waveforms;
    recording a first data sample;
    waiting a discrete section of time;
    recording a second data sample;
    comparing the first data sample to the second data sample to determine if the first constant and the second constant are stable;
    adjusting a frequency value of the first signal and the second signal if the first constant and the second constant are not stable and injecting the first signal with the frequency value into the RESS; and
    determining if the first constant and the second constant are stable and if stable, proceeding with the steps of processing the first constant and processing the second constant and if not stable, re-accomplishing calculating the low voltage signal, filtering the low voltage signal, recording the first data sample, waiting the discrete section of time, recording the second data sample, comparing the first data sample to the second data sample, adjusting the frequency value if the first constant and the second constant are not stable, injecting the first signal with the frequency value into the RESS, and determining if the first constant and the second constant are stable.

16. A method to indicate a coolant leak in a rechargeable energy storage system (RESS), the method comprising:
    monitoring a change in an isolation resistance of a high voltage bus in the RESS, wherein the isolation resistance is calculated using a monitor controller cooperative with a signal injection circuit and an output circuit, the monitor controller having a processor and a computer-readable medium executing an algorithm, the algorithm configured to:

a. inject, via a wire electrically coupled to the RESS, a first signal into the RESS using the signal injection circuit,
b. record, via at least one sensor, an output signal from the output circuit in response to the injection of the first signal,
c. multiply, via at least one multiplier, the first signal with the output signal to determine a first product,
d. multiply, via the at least one multiplier, a second signal with the output signal to determine a second product wherein the second signal is orthogonal to the first signal,
e. calculate a low voltage signal as a difference between the output signal and the first signal,
f. filter, via at least one filter, the low voltage signal to remove alternating current (AC) and harmonic waveforms,
g. record, via the at least one sensor, a first data sample,
h. wait a discrete section of time,
i. record, via the at least one sensor, a second data sample,
j. compare, via the processor, the first data sample to the second data sample to determine if a first constant and a second constant are stable,
k. adjust, via the processor, a frequency value of the first signal and the second signal if the first constant and the second constant are not stable and injecting the first signal with the frequency value into the RESS,
l. determine, via the processor, if the first constant and the second constant are stable and if stable, proceeding with the steps of processing the first constant and processing the second constant and if not stable, re-accomplishing the steps of e. through l.,
m. filter, via the at least one filter, the second product to determine the second constant,
n. receive, via the at least one sensor, sensor information which includes at least one of the following: an amplitude of the first signal, a frequency of the first signal, an inverting gain of an inverting amplifier, a multiply gain of a multiply amplifier, and a difference gain of a differential amplifier, and
o. calculate an isolation resistance value using the sensor information and the second constant;
indicating, via an indication system, a coolant leak warning if the isolation resistance value falls below a resistance threshold value, and
correcting, in response to the coolant leak warning, a leak within the RESS.

* * * * *